United States Patent
Fukudome et al.

(10) Patent No.: US 7,894,202 B2
(45) Date of Patent: Feb. 22, 2011

(54) MULTILAYER CAPACITOR

(75) Inventors: Hidetaka Fukudome, Sabae (JP); Masaaki Taniguchi, Fukui-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 866 days.

(21) Appl. No.: 11/836,601

(22) Filed: Aug. 9, 2007

(65) Prior Publication Data

US 2008/0037199 A1    Feb. 14, 2008

(30) Foreign Application Priority Data

Aug. 9, 2006    (JP)    ............... 2006-217593
Jul. 5, 2007    (JP)    ............... 2007-177561

(51) Int. Cl.
   *H05K 1/18*    (2006.01)
(52) U.S. Cl. ............... 361/763; 361/306.1; 361/306.3; 361/764; 361/765
(58) Field of Classification Search ... 361/306.1–306.3, 361/763–765
   See application file for complete search history.

(56) References Cited

U.S. PATENT DOCUMENTS 6,606,237 B1 *    8/2003    Naito et al. ............. 361/306.3
6,999,300 B2 *    2/2006    Togashi et al. .......... 361/306.3
7,072,169 B2 *    7/2006    Hayashi et al. .......... 361/306.3

FOREIGN PATENT DOCUMENTS

| JP | 11-111766 A | 4/1999 |
|---|---|---|
| JP | 2003-318064 A | 11/2003 |
| JP | 2003-318065 A | 11/2003 |
| JP | 2004-153040 A | 5/2004 |
| JP | 2004-281957 A | 10/2004 |
| JP | 2006-32747 A | 2/2006 |

* cited by examiner

*Primary Examiner*—Tuan T Dinh
(74) *Attorney, Agent, or Firm*—Keating & Bennett, LLP

(57) ABSTRACT

A multilayer capacitor includes a laminate of ceramic layers, and a capacitor unit provided in the laminate. In the multilayer capacitor, the relationships $P \geq Ra$ and $P \geq W$ are established, wherein P represents the average projection height of first and second via conductors from the upper surface, Ra represents the surface roughness of the upper surface, and W represents an amount of curvature of the laminate. Further, the projecting portions of the first and second via conductors projecting from the upper surface are buried in first and second external electrodes, respectively.

6 Claims, 12 Drawing Sheets

POSITION IN LAMINATE

POSITION IN LAMINATE

MULTILAYER CAPACITOR

BACKGROUND OF THE INVENTION

1. Field of the Invention

The present invention relates to a multilayer capacitor, and more specifically, to a multilayer capacitor including a ceramic layer and at least a pair of internal electrodes opposed to each other with the ceramic layer provided therebetween, a circuit board, a circuit module, and a method for manufacturing a multilayer capacitor.

2. Description of the Related Art

In a power supply circuit, when variations in voltage of a power supply line is increased, the impedance in the power supply line and ground causes an unstable operation of a circuit to be driven, interference between circuits through the power supply circuit, or oscillation. Therefore, a decoupling capacitor is typically connected between a power supply line and ground. The decoupling capacitor functions to decrease an alternating current impedance between the power supply line and the ground, thereby suppressing variation in power supply voltage and interference between circuits.

In communication apparatuses such as cellular phones and information processing apparatuses such as personal computers, the signal speed has been increasing for processing a large amount of information in recent years. Accordingly, the clock frequencies of the semiconductor integrated circuits (referred to as "IC" hereinafter) have been increasing. As a result, noise including many harmonic components often occurs, and thus, stronger decoupling is required for IC power supply circuits.

In order to enhance a decoupling effect, it is effective to use a decoupling capacitor having excellent impedance frequency characteristics. As such a decoupling capacitor, a multilayer ceramic capacitor may be used. A multilayer ceramic capacitor has low ESL (Equivalent Series Inductance) and thus, exhibits a high noise absorbing effect over a wide frequency band as compared to an electrolytic capacitor.

A known multilayer capacitor capable of decreasing ESL is shown in FIG. 12. Specifically, as shown in FIG. 12, a known multilayer capacitor 201 includes a laminate 202 in which a plurality of ceramic layers is laminated, at least a pair of a first internal electrode 203 and a second internal electrode 204 which are opposed to each other through the ceramic layer, first and second external electrodes 205 and 206 which are provided on the upper surface, third and fourth external electrodes 207 and 208 which are provided on the lower surface, first via conductors 209 for electrically connecting the first external electrodes 205, the first internal electrode 203, and the third external electrodes 207, and second via conductors 210 for electrically connecting the second external electrodes 206, the second internal electrode 204, and the fourth external electrodes 208.

In the multilayer capacitor 201, the first and second via conductors 209 and 210 having different polarities are alternately disposed, and thus, the magnetic fields produced around the first via conductors 209 and the magnetic fields produced around the second via conductors 210 are canceled by each other, thereby decreasing ESL. Further, the first and second external electrodes 205 and 206 and the third and fourth external electrodes 207 and 208 are provided on the upper and lower surfaces, respectively, of the laminate 202. Therefore, the multilayer capacitor 201 can be easily mounted between an IC and amounting substrate, and the distance between the multilayer capacitor 201 and IC can be decreased. As a result, in the multilayer capacitor 201, a higher decoupling effect is obtained.

In recent years, electronic components have been increasingly miniaturized. Therefore, the multilayer capacitor 201 shown in FIG. 12 must be decreased in thickness. As described above, this is because it is necessary to mount the multilayer capacitor 201 in the space between the IC and the mounting substrate or in the mounting substrate.

Further, the multilayer capacitor 201 is connected to the IC through a pin. Therefore, it is necessary that the first and second external electrodes 205 and 206 of the multilayer capacitor 201 have a connectable positional relationship to the pin of the IC. Thus, the dimensions of a main surface of the multilayer capacitor 201 depend on the dimensions of a main surface of the IC. For these reasons, the multilayer capacitor 201 has a thin plate shape.

However, the thin plate-shaped multilayer capacitor 201 has a problem in that it is easily curved during firing. When the multilayer capacitor 201 is curved during firing, the first and second external electrodes 205 and 206 and the third and fourth external electrodes 207 and 208 are not arranged in the same planes, thereby causing large variations in the distances between the multilayer capacitor 201 and the IC and between the multilayer capacitor 201 and the mounting substrate. As a result, the problem of causing incomplete electrical connections between the multilayer capacitor 201 and IC and between the multilayer capacitor 201 and the mounting substrate occurs.

With respect to this problem, Japanese Unexamined Patent Application Publication No. 2006-032747 discloses a multilayer electronic component in which the height of an external electrode is greater than an amount of curvature of a ceramic laminate. Specifically, conductive paste for external electrodes is applied twice, and the printing area in the upper stage is decreased so as to increase the height of external electrodes.

However, two conductive paste coating steps are undesirable because the number of steps is increased. In addition, when the printing areas in the upper and lower stages of external electrodes are different, it is necessary to prepare two types of printing plates for screen printing. Furthermore, even when the height of external electrodes is increased as in the multilayer electronic component described in Japanese Unexamined Patent Application Publication No. 2006-032747, the occurrence of curvatures causes variations in height of the external electrodes.

Relevant patent documents other than Japanese Unexamined Patent Application Publication No. 2006-032747 include Japanese Unexamined Patent Application Publication Nos. 11-111766, 2003-318064, 2003-318065, and 2004-153040. Japanese Unexamined Patent Application Publication No. 11-111766 discloses a wiring board in which a plating metal layer is deposited on at least the end of a projecting portion of a via conductor, and the height of the surface of the plating metal layer from the upper surface of an insulating substrate is about 10 µm to about 50 µm. Japanese Unexamined Patent Application Publication No. 2003-318064 discloses a multilayer capacitor in which the ends of first and second via hole conductors exposed in the two main surfaces of a laminate project from the main surfaces of the laminate, and one of the ends of each of the first and second via hole conductors projecting from the main surfaces of the laminate is coated with an oxide film. Japanese Unexamined Patent Application Publication No. 2003-318065 discloses a multilayer electronic component in which a via conductor passing through at least one of an uppermost insulating layer and a lowermost insulating layer of a laminate has a projecting portion integrally provided therein and projecting from the surface of the insulating layer. Japanese Unexamined Patent Application Publication No. 2004-153040 discloses a multilayer capacitor including a first terminal electrode formed by projecting a portion of a first via conductor, which is electrically connected to a first internal electrode layer and provided along the lamination direction of dielectric layers, from at least one of the two outermost surfaces substantially perpendicular to the lamination direction so as to have substantially the same outer diameter as that of the first via conductor, a first mounting terminal which has a first conductor pad electrically connected to the first terminal electrode and which is configured to have an outer diameter greater than that of the first terminal electrode and cover the first terminal electrode, a second terminal electrode formed by projecting a portion of a second via conductor, which is electrically connected to a second internal electrode layer and provided along the lamination direction, from at least one of the two outermost surfaces substantially perpendicular to the lamination direction so as to have substantially the same outer diameter as that of the second via conductor, and a second mounting terminal which has a second conductor pad electrically connected to the second terminal electrode and which is configured to have an outer diameter larger than that of the second terminal electrode and cover the second terminal electrode.

SUMMARY OF THE INVENTION

To overcome the problems described above, preferred embodiments of the present invention provide a multilayer capacitor capable of securely suppressing variations in heights of external electrodes even if curvature occurs during firing, a circuit board, a circuit module, and a method for manufacturing a multilayer capacitor.

According to preferred embodiments of the present invention, a multilayer capacitor includes a laminate including a plurality of ceramic layers. The laminate has a first surface and a second surface opposing the first surface. The multilayer capacitor includes at least one pair of first and second internal electrodes opposing each other with the ceramic layer provided therebetween. The multilayer capacitor includes first and second external electrodes provided on the first surface The multilayer capacitor includes third and fourth external electrodes provided on the second surface The multilayer capacitor includes a first via conductor for electrically connecting the first external electrode, the first internal electrode, and the third external electrode, the first via conductor being arranged to pass between the first and second surfaces and to have an end projecting from the first surface. The multilayer capacitor includes a second via conductor for electrically connecting the second external electrode, the second internal electrode, and the fourth external electrode, the second via conductor being arranged to pass between the first and second surfaces and to have an end projecting from the first surface. In the multilayer capacitor, the relationships $P \geq Ra$ and $P \geq W$ are established, wherein P represents the average projection height of the first and second via conductors from the first surface, Ra represents the surface roughness of the first surface, and W represents an amount of curvature of the laminate. Further, the projecting portions of the first and second via conductors projecting from the first surface are buried in the first and second external electrodes, respectively.

In the multilayer capacitor, even when curvatures occur during firing, it is possible to suppress variations in heights of the first and second external electrodes in the lamination direction, form the first and second external electrodes without thinning, and improve the adhesive strength between the first and second external electrodes and the first surface of the laminate.

The average projection height P is preferably about 2 µm to about 15 µm, for example.

When the average projection height is less than about 2 µm, connection failure may occur between the first and second via conductors and the first and second external electrodes. When the average projection height exceeds about 15 µm, the pattern of the first and second external electrodes may be thinned during printing. Therefore, as described above, the average projection height P is preferably about 2 µm to about 15 µm in order to prevent connection failure and printing thinning.

The surface roughness Ra is preferably about 2 µm or less, for example.

When the surface roughness Ra exceeds about 2 µm, the adhesive strength between the first and second external electrodes and the first surface of the laminate may be decreased. Therefore, the surface roughness Ra is preferably about 2 µm or less in order to enhance the adhesive strength between the first and second external electrodes and the first surface of the laminate.

In preferred embodiments of the present invention, the amount of curvature W of the laminate is preferably about 10 µm or less, for example.

When the amount of curvature W exceeds about 10 µm, variation occurs in the positions of the first and second external electrodes in the lamination direction. Therefore, the amount of curvature W is preferably about 10 µm or less in order to suppress variation in the positions of the first and second external electrodes in the lamination direction and suppress connection failure between the first and second external electrodes and an IC.

Preferred embodiments of the present invention can be applied to a circuit board which will be described below. Specifically, a circuit board includes a board body made of an insulating material, a plurality of input/output terminals provided on the surface of the board body, a plurality of wirings electrically connected to the input/output terminals, and the above-described multilayer capacitor. In a state in which the plurality of wirings is electrically connected to the third and fourth external electrodes, the multilayer capacitor is mounted on the board body. The circuit board can be applied to a circuit module described below. Specifically, a circuit module includes the circuit board and a semiconductor integrated circuit mounted on the circuit board. The multilayer capacitor is electrically connected to the semiconductor integrated circuit through the first and second external electrodes.

A multilayer capacitor according to preferred embodiments of the present invention can be manufactured by a method described below. Specifically, a multilayer capacitor can be manufactured by a method for manufacturing a multilayer capacitor including a laminate including a plurality of ceramic layers, a plurality of internal electrodes disposed in the laminate and defining a capacitor unit, external electrodes formed on a main surface of the laminate, and via conductors for electrically connecting the external electrodes and the internal electrodes. The method includes a first step of forming the fired laminate, a second step of planarizing the main surface of the fired laminate by lapping, and a third step of forming the plurality of external electrodes on the planarized main surface.

In the method for manufacturing the multilayer capacitor, the main surface of the laminate is planarized after firing of the laminate and before the formation of the external electrodes. Therefore, even when the laminate is curved during firing, variations in heights of the external electrodes are suppressed by planarization.

In the manufacturing method, in the second step, the ends of the via conductors preferably project from the main surface by lapping.

When the ends of the via conductors project from the main surface, the external electrodes can be securely electrically connected to the via conductors.

According to a preferred embodiment of the present invention, the relationships $P \geqq Ra$ and $P \geqq W$ are established, wherein P represents the average projection height of the first and second via conductors from the first surface, Ra represents the surface roughness of the first surface, and W represents an amount of curvature of the laminate. Furthermore, the projecting portions of the first and second via conductors projecting from the first surface are buried in the first and second external electrodes, respectively. Therefore, even when curvature occurs during firing, it is possible to suppress variations in height of the first and second external electrodes in the lamination direction, form the first and second external electrodes without thinning, and improve the adhesive strength between the first and second external electrodes and the first surface of the laminate.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
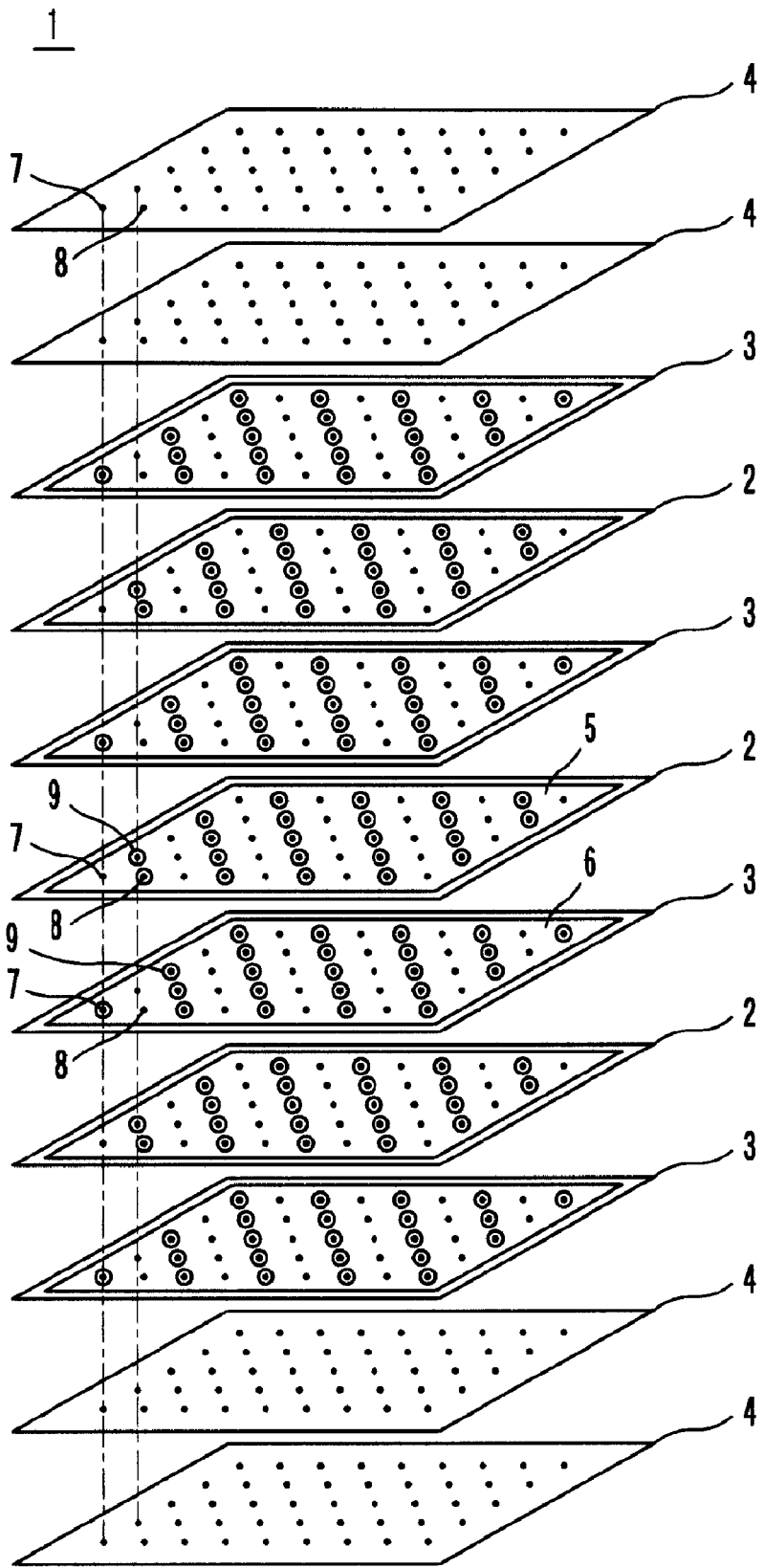
FIG. 1 is an exploded perspective view of a multilayer capacitor according to a first preferred embodiment of the present invention.

A multilayer capacitor, a circuit board, a circuit module, and a method for manufacturing a multilayer capacitor according to preferred embodiments of the present invention will be described with reference to the drawings. In the drawings of first to third preferred embodiments described below, the same members and portions are denoted by the same reference numerals, and duplicate description is omitted.

First Preferred Embodiment

Figure 2:
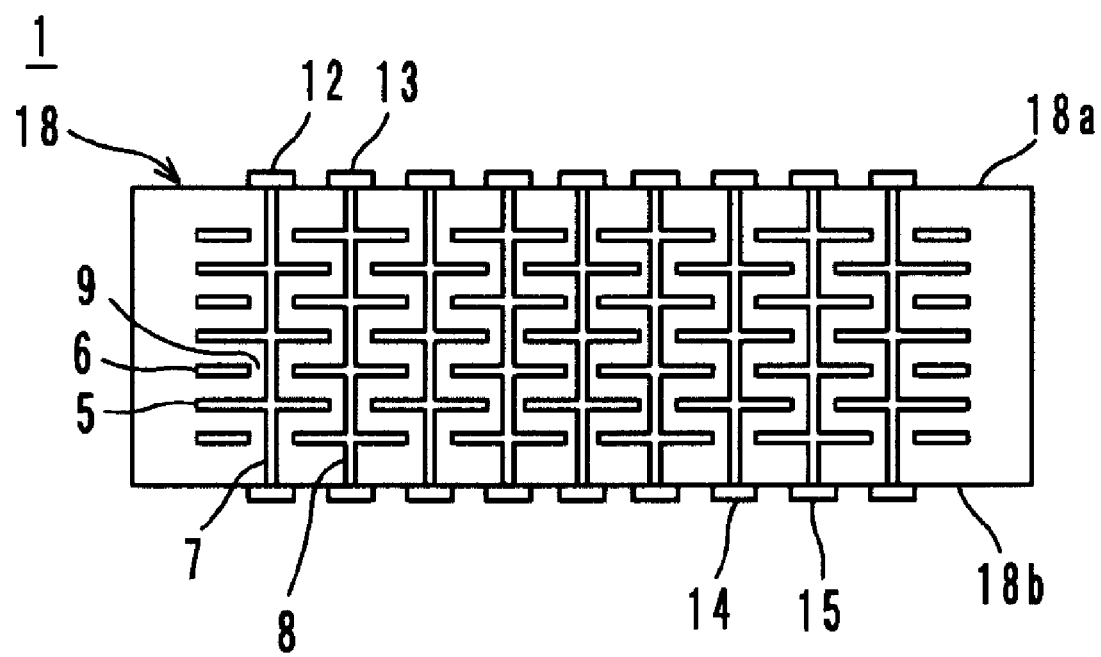
FIG. 2 is a sectional view showing the structure of the multilayer capacitor shown in FIG. 1.

FIG. 1 is an exploded perspective view of a multilayer capacitor 1 according to a first preferred embodiment of the present invention. FIG. 2 is a sectional view showing the structure of the multilayer capacitor 1. As shown in FIG. 1, the multilayer capacitor 1 includes first ceramic layers 2, second ceramic layers 3, and third ceramic layers 4. The first and second ceramic layers 2 and 3 are alternately laminated. The third ceramic layers 4 are laminated to form an alternate laminate of the first and second ceramic layers 2 and 3 in the vertical direction along the lamination direction. The first ceramic layers 2, the second ceramic layers 3, and the third ceramic layers 4 define a laminate 18 shown in FIG. 2. As shown in FIG. 2, first and second external electrodes 12 and 13 are provided on the upper surface 18a of the laminate 18, and third and fourth external electrodes 14 and 15 are provided on the lower surface 18b of the laminate 18.

The first ceramic layers 2, the second ceramic layers 3, and the third ceramic layers 4 are dielectric ceramic layers composed of, for example, $BaTiO_3$, $CaTiO_3$, $SrTiO_3$, or $CaZrO_3$ as a main component. Further, a Mn compound, a Fe compound, a Cr compound, a Co compound, or a Ni compound may be added as a sub-component to the main component. The thickness of the first ceramic layers 2, the second ceramic layers 3, and the third ceramic layers 4 after firing is preferably about 2.0 μm to about 5.0 μm, for example.

Further, a first internal electrode 5 is provided on a main surface of each of the first ceramic layers 2, and first and second via conductors 7 and 8 are arranged to pass through the first ceramic layers 2 in the lamination direction. A second internal electrode 6 is provided on a main surface of each of the second ceramic layers 3, and the first and second via conductors 7 and 8 are arranged to pass through the second ceramic layers 3 in the lamination direction. The first and second via conductors 7 and 8 are arranged to pass through the third ceramic layers 4 in the lamination direction. The first or second internal electrodes 5 or 6 are not provided on the main surfaces of the third ceramic layers 4.

The first and second internal electrodes 5 and 6 are composed of a metal, such as Ni, Cu, Ag, Pd, an Ag—Pd alloy, or Au, and define capacitor electrodes. Specifically, the first and second internal electrodes 5 and 6 oppose each other with each of the first or second ceramic layers 2 or 3 provided therebetween to define one capacitor. The thickness of the first and second internal electrodes 5 and 6 after firing is preferably about 0.8 μm to about 1.2 μm, for example.

The first via conductors 7 are composed of a material including a metal, such as Ni, Cu, Ag, Pd, an Ag—Pd alloy, or Au and ceramic and are arranged to pass between the upper and lower surfaces 18a and 18b and electrically connect the first external electrodes 12, the first internal electrodes 5, and third external electrodes 14 as shown in FIG. 2. The second via conductors 8 are composed of a material including a metal, such as Ni, Cu, Ag, Pd, an Ag—Pd alloy, or Au and ceramic and are arranged to pass between the upper and lower surfaces 18a and 18b and electrically connect the second external electrodes 13, the second internal electrodes 6, and fourth external electrodes 15 as shown in FIG. 2. As shown in FIG. 1, the first and second via conductors 7 and 8 are arranged in a dot matrix-like configuration and an island-like shape in the first, second, and third ceramic layers 2, 3, and 4. The first via conductors 7 are insulated from the second internal electrodes 6. Therefore, circular or substantially circular holes 9 are provided in the second internal electrodes 6 at positions corresponding to the first via conductors 7. The second via conductors 8 are insulated from the first internal electrodes 5. Therefore, circular or substantially circular holes 9 are provided in the first internal electrodes 5 at positions corresponding to the second via conductors 8.

Figure 3:
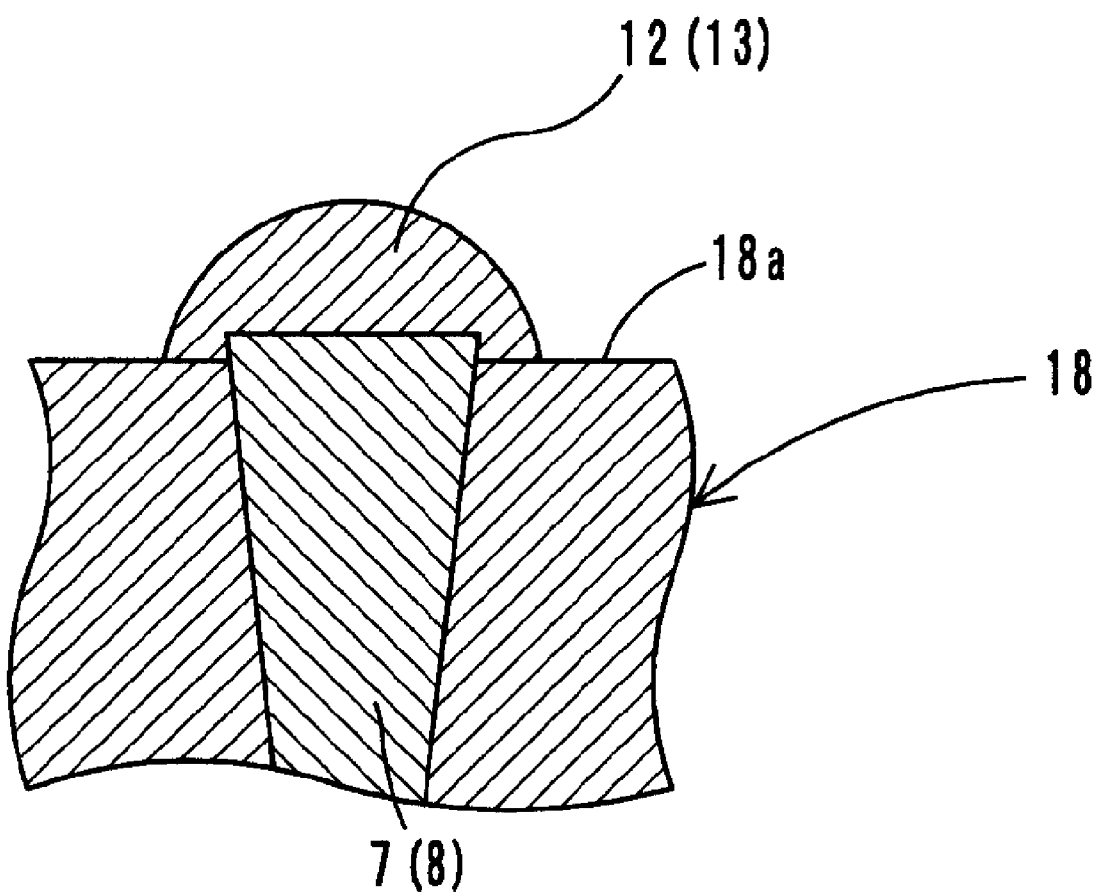
FIG. 3 is a sectional view showing the structure of each of first and second via conductors near the upper surface.

FIG. 3 is a sectional view showing the structure of each of the first and second via conductors 7 and 8 near the upper surface 18a. The first and second via conductors 7 and 8 project upward from the upper surface 18a in the lamination direction. The portions of the first and second via conductors 7 and 8 projecting from the upper surface 18a are polished to remove oxide films from the surfaces thereof as described below and buried in the first and second external electrodes 12 and 13, respectively. The oxide films need not be completely removed. The average height (referred to as the "via projection height P" hereinafter) of the first and second via conductors 7 and 8 from the upper surface 18a is preferably about 2 μm to 15 μm, for example. When the via projection height P is less than about 2 μm, defective connection may occur between the first and second via conductors 7 and 8 and the first and second external electrodes 12 and 13. When the via projection height P is greater than about 15 μm, the pattern of the first and second external electrodes 12 and 13 may be thinned during printing. The method of measuring the via projection height P will be described later.

The diameter of the first and second via conductors 7 and 8 after firing is preferably about 50 μm to about 150 μm, for example. When the diameter is less than about 50 μm, filling of paste becomes difficult the paste fails to securely connect the respective layers. On the other hand, when the diameter exceeds about 150 μm, moisture resistance may be degraded. When the first and second via conductors 7 and 8 have a tapered shape, the diameter at an intermediate point of each of the first and second via conductors 7 and 8 in the length direction is considered to be the diameter. The practical length of the first and second via conductors 7 and 8 after firing is about 100 μm to about 1000 μm, for example. The interval between the first via conductor 7 and the second via conductor 8 is preferably about 300 μm to about 600 μm, for example. The number of the first via conductor 7 and the second via conductor 8 together is preferably about 36 to about 729 in sum total.

The first and second via conductors 7 and 8 are preferably composed of, as the main component, the same metal as the first and second internal electrodes 5 and 6. Therefore, the adhesion between the first and second via conductors 7 and 8 and the first and second internal electrodes 5 and 6 is improved. In the specification, the term "main component" represents a component at a content of 50% by weight or more of the total.

Figure 4:
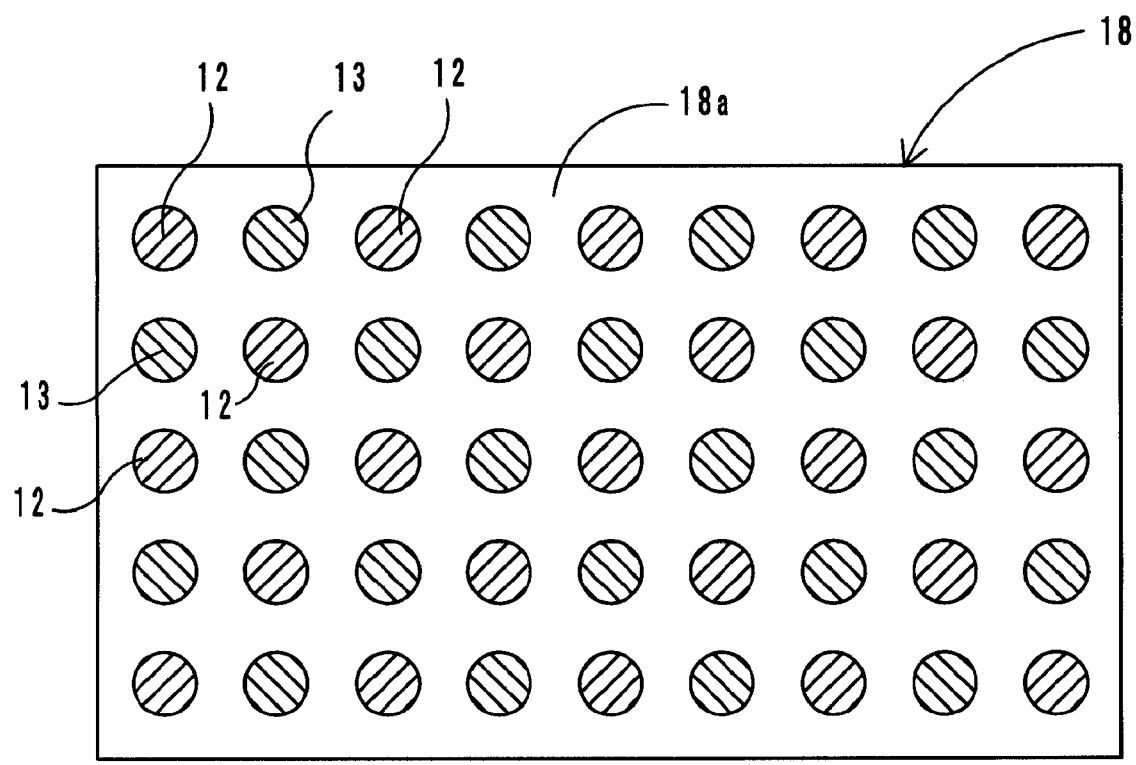
FIG. 4 is a plan view showing the multilayer capacitor shown in FIG. 1 as viewed from above in the lamination direction.

FIG. 4 is a plan view of the multilayer capacitor 1 as viewed from above in the lamination direction. As shown in FIG. 4, the first external electrodes 12 electrically connected to the respective first via conductors 7 are formed in an island-like shape on the upper surface 18a of the laminate 18. Similarly, the second external electrodes 13 electrically connected to the respective second via conductors 8 are formed in an island-like shape on the upper surface 18a of the laminate 18 so as not to overlap the first external electrodes 12. The first and second external electrodes 12 and 13 are composed of a sintered metal and are configured so that the contact portions with the first and second via conductors 7 and 8 are solid-dissolved. A metal such as Cu, Ni, Ag, Pd, an Ag—Pd alloy, or Au is used for the first and second external electrodes 12 and 13. When an IC is mounted on the multilayer capacitor 1 by soldering, Cu is used for the first and second external electrodes 12 and 13, and the Cu layer is plated with Ni and Sn. When an IC is mounted on the multilayer capacitor 1 with a conductive adhesive, Ag, Pd, or an Ag—Pd alloy is used for the first and second external electrodes 12 and 13.

The thickness of the first and second external electrodes 12 and 13 is preferably about 20 μm to about 60 μm, for example. Furthermore, the diameter of the first and second external electrodes 12 and 13 on the upper surface 18a is preferably at least about 200 μm, for example. This is because it is necessary to sufficiently cover the ends of the first and second via conductors 7 and 8 with the first and second external electrodes 12 and 13, respectively. Also, this is because during manufacture a circuit board which will be described below, it is necessary to prevent damage to the laminate 18 due to deviation of a laser irradiation position when via holes are formed by laser irradiation from the outside after the multilayer capacitor 1 is buried in a resin substrate in order to amount the multilayer capacitor 1 on the resin substrate.

As shown in FIG. 3, the first and second external electrodes 12 and 13 preferably have a shape in which a central portion rises upward. This is because during soldering, melted solder easily escapes to the peripheries of the first and second external electrodes 12 and 13 to prevent the occurrence of a so-called solder bridge in which melted solder contacts adjacent solder. The first and second external electrodes 12 and 13 may have a hill-like shape that is smoother than the shape shown in FIG. 3.

The amount of curvature W of the laminate 18 after firing is preferably about 10 μm or less, for example. When the amount of curvature exceeds about 10 μm, variation may occur in the positions of the first and second external electrodes 12 and 13 in the lamination direction, thereby causing defective connection between the first and second external electrodes 12 and 13 and an IC. The method of measuring the amount of curvature W will be described later.

The surface roughness Ra of the upper surface 18a of the laminate 18 is preferably about 2 μm or less, for example. When the surface roughness Ra exceeds about 2 μm, the adhesive strength between the upper surface 18a of the laminate 18 and the first and second external electrodes 12 and 13 may be decreased. The surface roughness Ra is arithmetic average roughness specified by JIS B0601.

With respect to the above-described via projection height P, surface roughness Ra of the upper surface 18a, and amount of curvature W of the laminate 18, it is necessary that the via projection height P is greater than the surface roughness Ra and the amount of curvature W. As a result, even when curvature occurs in the multilayer capacitor 1 during firing, variations in height of the first and second external electrodes 12 and 13 in the lamination direction can be suppressed, and the first and second external electrodes 12 and 13 can be formed without thinning, and therefore, the adhesive strength between the first and second external electrodes 12 and 13 and the upper surface 18a of the laminate 18 is improved.

The first and second via conductors 7 and 8 project from the upper surface 18a of the laminate 18, and the respective projecting portions are buried in the first and second external electrodes 12 and 13. Therefore, in the multilayer capacitor 1, the first and second via conductors 7 and 8 can be securely electrically connected to the first and second external electrodes 12 and 13, respectively. Further, in the multilayer capacitor 1, the respective projecting portions are buried in the first and second external electrodes 12 and 13. Therefore, unlike in the wiring board disclosed in Japanese Unexamined Patent Application Publication No. 11-111766, oxidation of the first and second via conductors 7 and 8 with ambient air is prevented.

Furthermore, since the via projection height P is about 2 µm to about 15 µm, the first and second external electrodes 12 and 13 can be formed without thinning, and the first and second via conductors 7 and 8 can be securely electrically connected to the first and second external electrodes 12 and 13, respectively. Japanese Unexamined Patent Application Publication Nos. 2003-318064 and 2003-318065 disclose multilayer electronic components in each of which the projection height of via conductors is several tens to several hundreds of µm. However, in such multilayer electronic components, external electrodes cannot be precisely formed because the projection height of via conductors is excessively large.

In the multilayer capacitor 1, the conditions of the surface roughness Ra and the via projection height P of the lower surface 18b may be the same as those of the upper surface 18a. In addition, the shape of the third and fourth external electrodes 14 and 15 may be the same as that of the first and second external electrodes 12 and 13.

Method for Manufacturing Multilayer Capacitor

Next, the method for manufacturing the multilayer capacitor 1 will be described. First, ceramic green sheets and conductive paste are prepared. Among the prepared ceramic green sheets, the conductive paste is printed in a predetermined pattern, by screen printing, on the ceramic green sheets used for the first and second ceramic layers 2 and 3. As shown in FIG. 1, the predetermined pattern preferably is a substantially rectangular electrode pattern having the island-like voids 9. As a result, the patterns of the first and second internal electrodes 5 and 6 are formed.

Next, a predetermined number of the ceramic green sheets on each of which the pattern of the first or second internal electrode has been printed is laminated. A predetermined number of the ceramic green sheets on each of which the pattern of the first or second internal electrode has been not printed is laminated above and below the laminate of the ceramic green sheets each having the internal electrode pattern in the lamination direction to prepare a mother laminate. If required, the mother laminate is compressed from above and below in the lamination direction using a hydrostatic press.

Next, a plurality of via holes is formed with a laser or NC punch to pass through the mother laminate in the lamination direction. In this preferred embodiment, the via holes are formed in a dot matrix configuration as shown in FIG. 1.

Next, the via holes are filled with the conductive paste by screen printing to form the first and second via conductors 7 and 8. In this step, the main surface of the mother laminate is preferably masked to prevent the conductive paste from adhering to portions other than the via holes. In order to facilitate the entrance of the conductive paste into the via holes, air in the via holes is preferably sucked through the openings opposite to the filling openings for the conductive paste.

Next, the mother laminate is cut into a predetermined size to prepare a green ceramic laminate. The green ceramic laminate is fired at about 900° C. to about 1300° C. in an atmosphere of air, nitrogen, or a mixed gas of water vapor and nitrogen. As a result, the fired laminated 18 is obtained.

Figure 5:
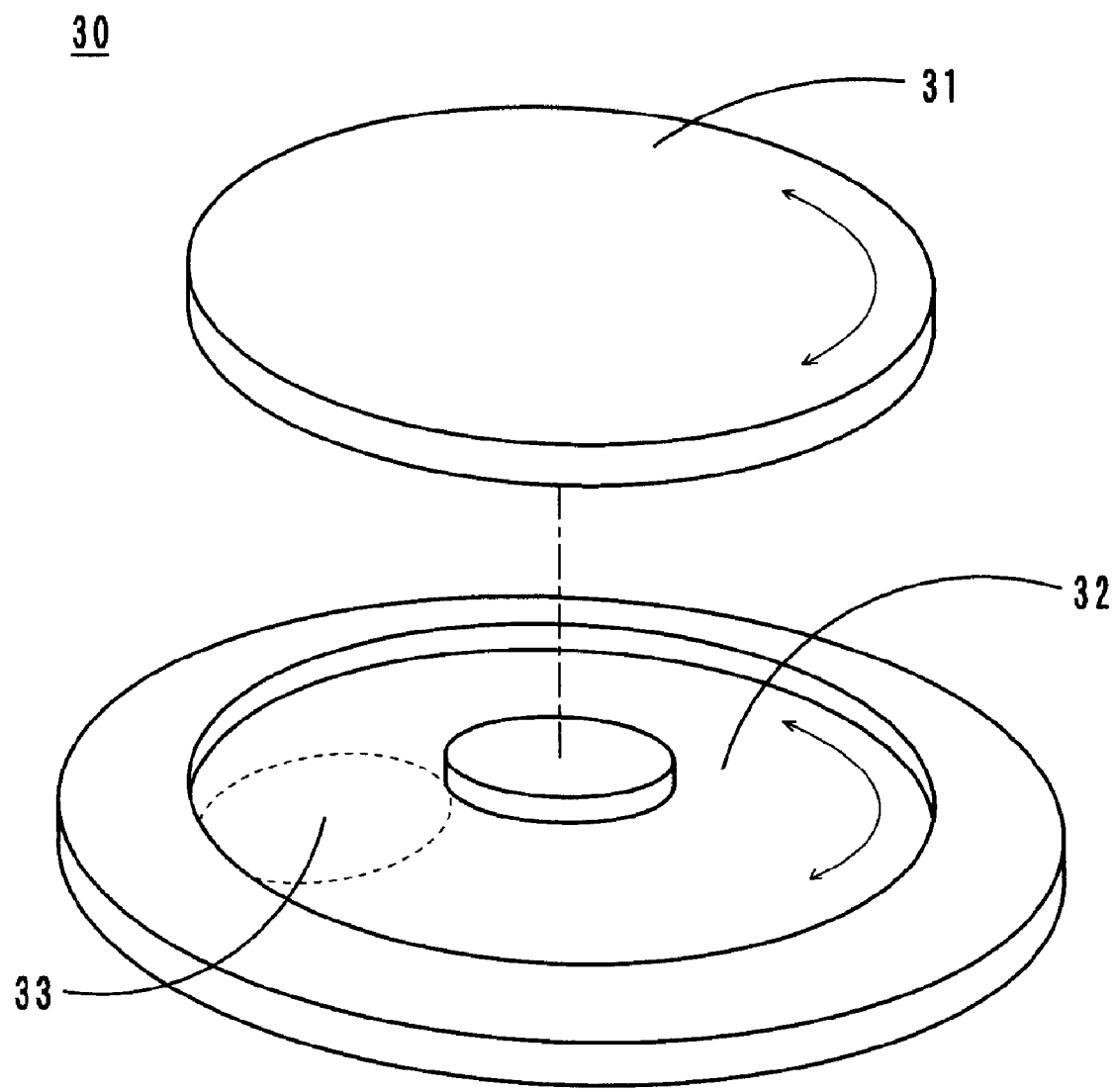
FIG. 5 is a perspective view showing the appearance of a principal portion of a lapping apparatus.
Figure 6:
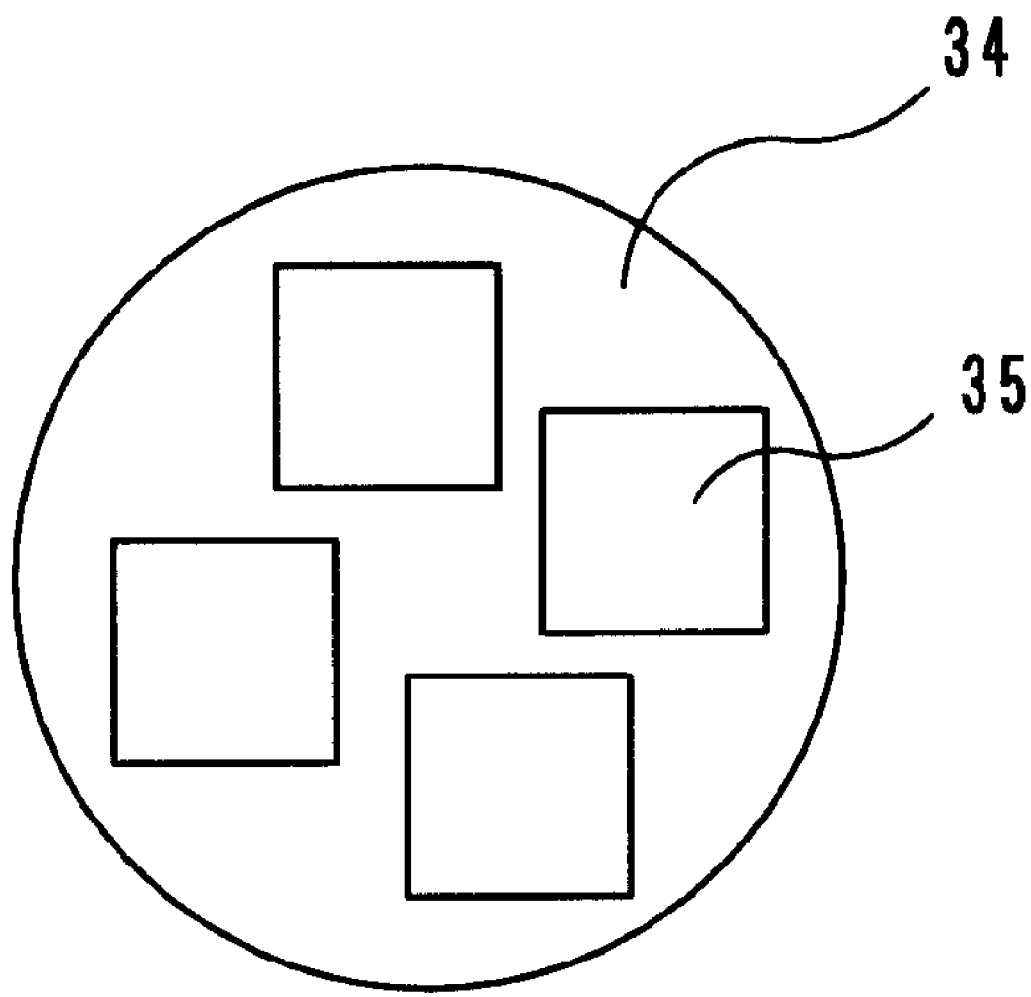
FIG. 6 is a perspective top view showing a carrier used in a lapping apparatus.
Figure 7:
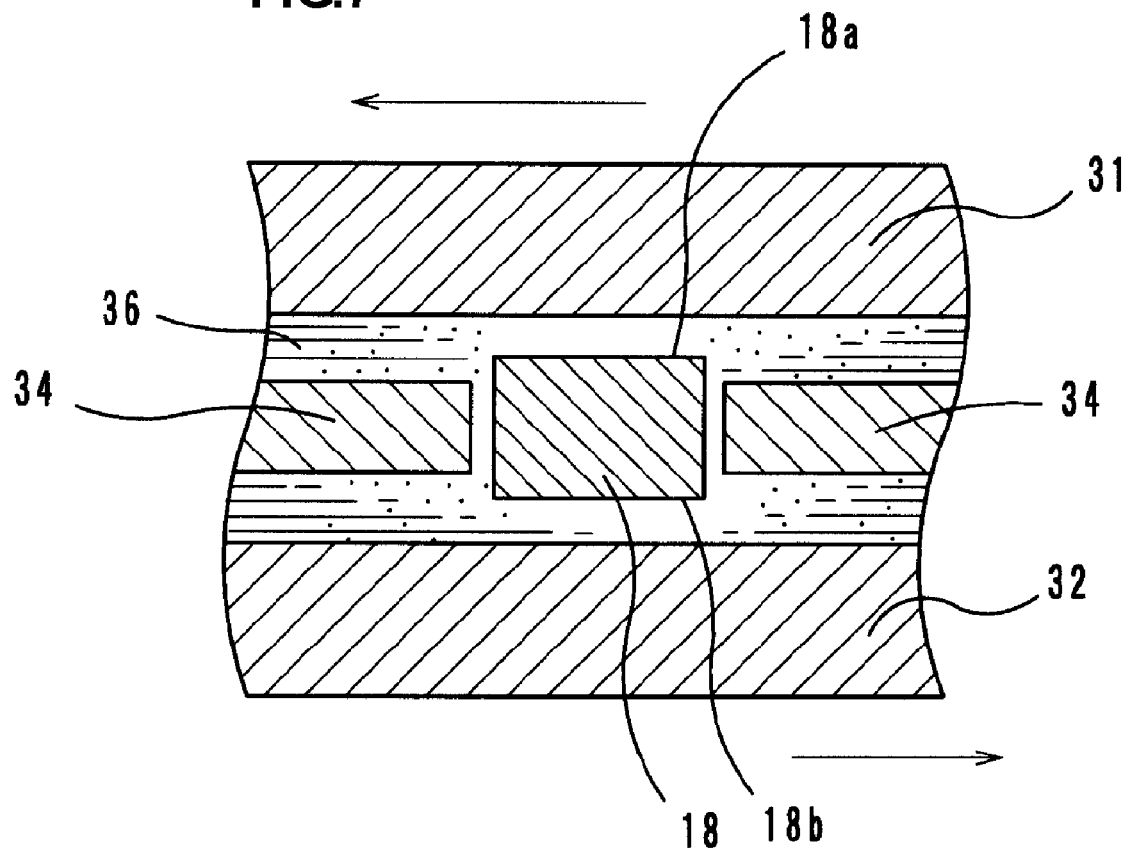
FIG. 7 is a view illustrating lapping.

Next, the upper and lower surfaces 18a and 18b of the laminate 18 are planarized by lapping. The lapping will be described below with reference to the drawings. FIG. 5 is a perspective view showing the appearance of a principal portion of a lapping apparatus 30. FIG. 6 is a perspective top view showing a carrier 34 used in the lapping apparatus 30. FIG. 7 is a view illustrating the lapping.

As shown in FIG. 5, the lapping apparatus 30 includes an upper platen 31 and a lower platen 32. The lower platen 32 has a carrier mounting position 33 provided for mounting the carrier 34 shown in FIG. 6. The carrier 34 includes a disk having holes 35 provided therein.

In the lapping step, the carrier 34 is installed on the lower platen 32, and the laminate 18 is placed in one of the holes 35. Next, the upper platen 31 is moved downward to hold the carrier 34 between the upper platen 31 and the lower platen 32 in the vertical direction. Then, the upper platen 31 and the lower platen 32 are rotated while slurry including abrasive grains is injected. As a result, as shown in FIG. 7, the upper surface 18a and the lower surface 18b of the laminate 18 are polished, with the laminate 18 being fixed by the carrier 34.

Since, in the lapping step, the slurry 36 including abrasive grains moves in parallel with the upper surface 18a and the lower surface 18b of the laminate 18, the laminate 18 composed of ceramic having brittleness is polished, while the first and second via conductors 7 and 8 having ductility are extended without being polished. Therefore, both ends of each of the first and second via conductors 7 and 8 project from the upper surface 18a and the lower surface 18b, respectively. Furthermore, the upper surface 18a and the lower surface 18b of the laminate 18 are planarized by polishing, and thus, the amount of curvature W of the laminate 18 is decreased. Further, the oxide films present on the surfaces of the first and second via conductors 7 and 8 are removed to decrease the resistance at the ends of the first and second via conductors 7 and 8.

Besides the lapping step, are ultrasonic processing, blasting, and barreling are alternative methods. However, the processing methods other than lapping are unsuitable for processing the upper surface 18a and the lower surface 18b of the laminate 18 for the reasons described below. Ultrasonic processing and barreling have weak polishing force and do not sufficiently polish the sintered laminate 18. Blasting includes vertically spraying abrasive grains towards the upper surface 18a and the lower surface 18b, and thus the laminate 18 may be embrittled to decrease the adhesive strength of the first to fourth external electrodes 12 to 15 and push the ends of the first and second via conductors 7 and 8 into the laminate 18.

Next, the conductive paste is printed on the upper surface 18a and the lower surface 18b of the laminate 18 by screen printing to form the patterns of the first external electrodes 12, the second external electrodes 13, the third external electrodes 14, and the fourth external electrodes 15. Then, the patterns are baked at about 600° C. to about 900° C. in an atmosphere of air, nitrogen, or mixed gas of water vapor and nitrogen. As a result, the first and second external electrodes 12 and 13 and the third and fourth external electrodes 14 and 15 are formed to cover both ends of the first and second via conductors 7 and 8. If required, the surfaces of the first external electrodes 12, the second external electrodes 13, the third external electrodes 14, and the fourth external electrodes 15 may be plated. The multilayer capacitor 1 is completed through the above-described steps.

Each of the ceramic green sheets and the conductive paste includes a binder and a solvent. Known organic binders and organic solvents can be used as the binder and the solvent.

As described above, according to the method for manufacturing the multilayer capacitor 1, the upper surface 18a and the lower surface 18b of the laminate 18 are planarized after firing of the laminate 18 and before the first to fourth external electrodes 12 to 15 are formed. Therefore, even when the laminate 18 is curved during firing, variations in height of the first to fourth external electrodes 12 to 15 are prevented by planarization. Although Japanese Unexamined Patent Application Publication No. 2004-153040 discloses a multilayer capacitor in which, similar to the multilayer capacitor 1, via conductors projecting from the lower surface are covered with terminal electrodes, the planarization which is a characteristic of the multilayer capacitor 1 is not described.

Other Manufacturing Methods

The above-described manufacturing method includes preparing the mother laminate, forming the via holes, filling the via holes with the conductive paste to form the via conductors. However, the method of forming the via conductors is not limited thereto. For example, via holes may be formed in each of ceramic green sheets and then filled with conductive paste, and then the ceramic green sheets may be laminated to prepare a mother laminate.

Although, in the above-described manufacturing method, the mother laminate is cut and then fired, the procedures for preparing the laminate are not limited thereto. For example, cut grooves may be formed at predetermined cutting positions of the mother laminate, and then the mother laminate is fired. After firing, the mother laminate may be divided along the cut grooves to prepare the laminate. In this case, polishing may be performed before the division step.

Experimental Results

In order to further clarify the effect of the multilayer capacitor 1, the inventors conducted the experiments described below. Specifically, seven types of samples were prepared by the manufacturing method described below, and the via projection height P, the surface roughness Ra, the amount of curvature W, resistance, and adhesive strength of each sample were measured. Whether or not the first and second external electrodes 12 and 13 were thinned was checked by observing the appearance.

First, the method of manufacturing the samples will be described. Ceramic green sheets including ceramic powder composed of $BaTiO_3$ as the main component were prepared. The thickness of the ceramic green sheets after firing was about 3 μm. Also, conductive paste for internal electrodes and via conductors, which included Ni powder, was prepared.

The pattern of an internal electrode was printed on a main surface of each of the ceramic green sheets using the conductive paste for internal electrodes. Then, a predetermined number of the ceramic green sheets on each of which the internal electrode pattern had been formed was laminated, and the ceramic green sheets on each of which the internal electrode pattern had not been formed were laminated above and below the resulting laminate to prepare a mother laminate. The mother laminate was compressed by hydrostatic pressing in the lamination direction.

Next, via holes were formed by a laser so as to pass through the mother laminate in the lamination direction. The diameter of the via holes after firing was about 120 μm. The number of via holes was 169 per laminate after cutting.

Next, the via holes were filled with the conductive paste for via conductors by screen printing to form via conductors. Then, the mother laminate was cut with a dicer to cut out a green laminate. The green laminate was fired at about 1250° C. in a neutral atmosphere.

Next, the upper and lower surfaces of a plurality of laminates obtained by firing were polished by blasting or lapping. The lapping was performed under five types of polishing conditions. Some of the laminates were not polished.

After polishing, an external electrode pattern was formed on each laminate by screen printing using the conductive paste for external electrodes containing Cu as the main component. Then, the external electrode pattern was baked at 800° C. in a reducing atmosphere to form the external electrodes.

Finally, the surfaces of the external electrodes were plated with Ni and then Sn to prepare seven types of multilayer capacitors. Each of the multilayer capacitors had the dimensions of about 5 mm×about 5 mm×about 0.85 mm.

Next, the via projection height P, the surface roughness Ra, the amount of curvature W, resistance, and adhesive strength of each multilayer capacitor were measured. Whether or not the external electrodes were thinned was determined by observing the appearance. The method for measuring each parameter will be described below.

Figure 8A:
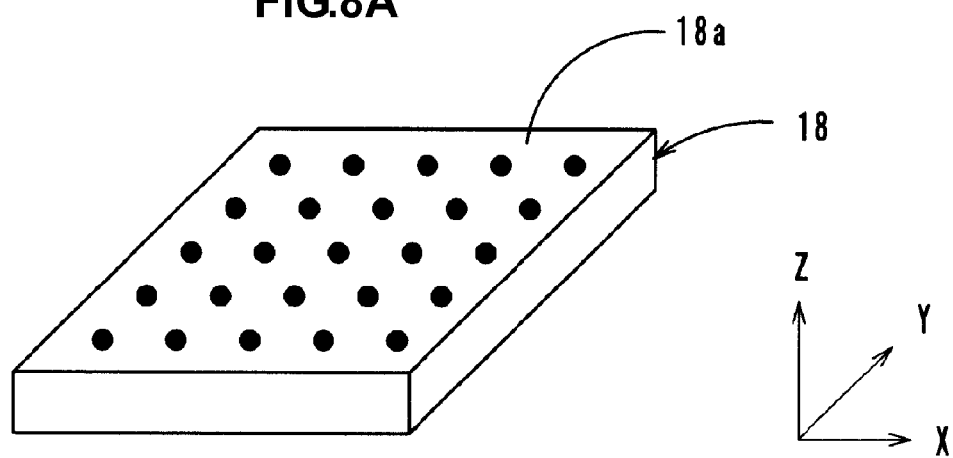
FIGS. 8A to 8C are drawings illustrating measurement of an amount of curvature.
Figure 8B:
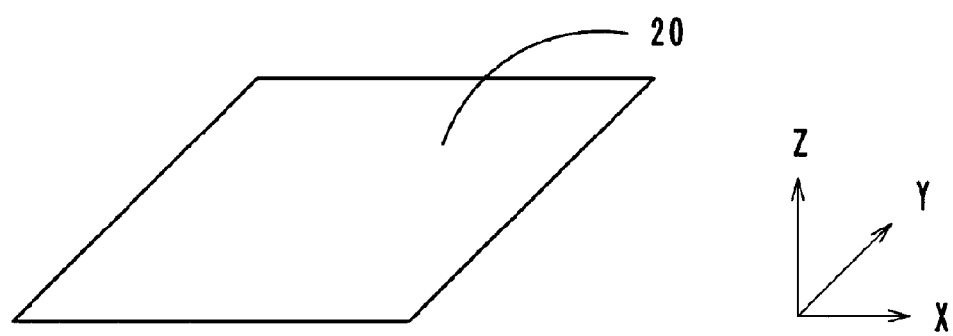
Figure 8C:
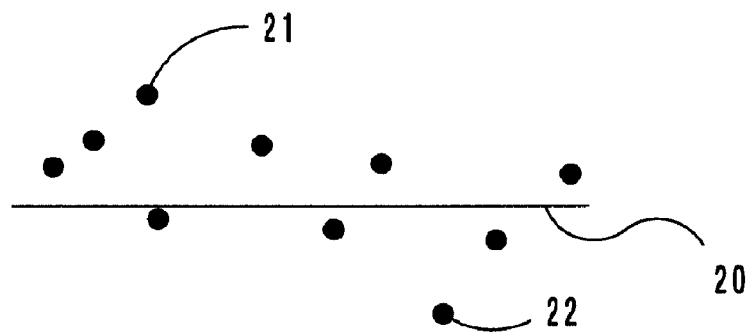

The measurement of the amount of curvature W will be described with reference to FIGS. 8A to 8C. FIGS. 8A to 8C are drawings illustrating the measurement of the amount of curvature W. As shown in FIG. 8A, the X, Y, and Z coordinates at 25 points at equal intervals on the upper surface 18a of the multilayer capacitor 1 were measured with a laser displacement meter.

Next, as shown in FIG. 8B, a plane 20 closest to the 25 points was determined by calculation. Next, as shown in FIG. 8C, the distances between the plane 20 and each of the points 25 were calculated to specify a point 21 that is separated to the greatest extent from the plane 20 in the upward direction and a point 22 that is separate to the greatest extent from the plane 20 in the downward direction. Then, the distances between the plane 20 and the point 21 and between the plane 20 and the point 22 were summed up, and the sum of the two distances was determined as the amount of curvature W.

Figure 9A:
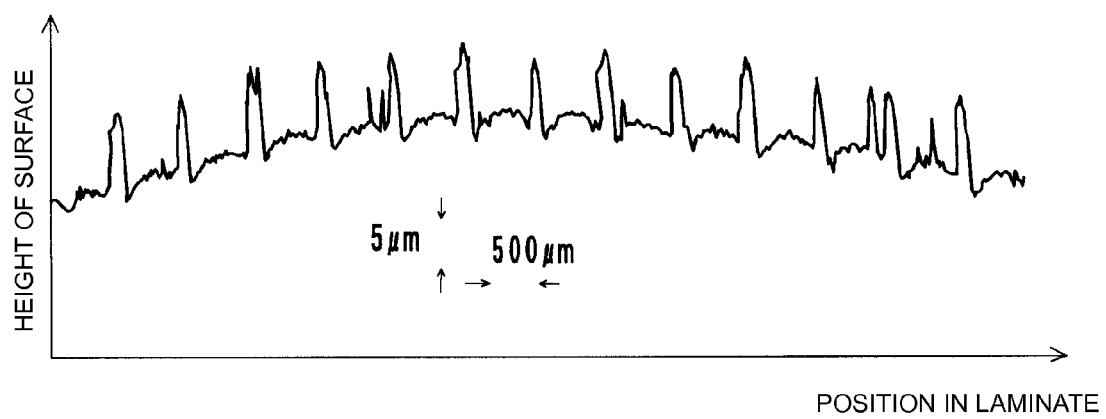
FIGS. 9A and 9B are graphs each showing the shape of the upper surface of the multilayer capacitor shown in FIG. 1.
Figure 9B:
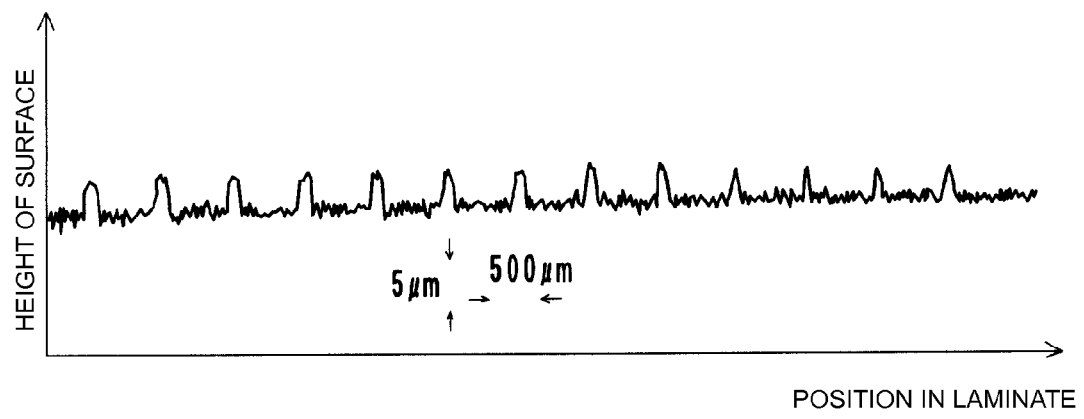

The method of measuring the surface roughness Ra and the via projection height P will be described with reference to FIGS. 9A and 9B. FIG. 9A is a graph showing the shape of the unpolished upper surface of a multilayer capacitor, and FIG. 9B is a graph showing the shape of the polished upper surface of a multilayer capacitor. As shown in FIG. 9A, the unpolished upper surface of the multilayer capacitor is curved so that the central portion rises upward. On the other hand, as shown in FIG. 9B, the polished upper surface of the multilayer capacitor is substantially horizontal. However, in both multilayer capacitors, the via conductors greatly project upward. Therefore, the surface roughness Ra was measured according to JIS (Japan Industrial Standard) B0601 after the portions other than the projecting portions of the via conductors were extracted. For the via projection height P, the maximum heights of the via conductors were averaged.

For the resistance, a direct current was passed between an external electrode formed on the upper surface and an external electrode formed on the lower surface, and the resistance was measured. On the basis of the resistance, connection between external electrodes and via conductors was evaluated.

For the adhesive strength between the external electrodes and the laminate, die shear strength was measured on the basis of MIL-STD-883 Method 2019. Specifically, a test terminal was floated at a distance of about 5.0 μm from a multilayer capacitor, and shear strength in the transverse direction was applied to the external electrodes at a speed of about 100 μm/s to measure a load when the external electrodes were separated.

Table 1 shows the results of the measurements. Sample 1 is a multilayer capacitor subjected to blasting for polishing. Samples 2 to 6 are multilayer capacitors subjected to lapping for polishing. Sample 7 is a multilayer capacitor not subjected to polishing.

TABLE 1

|  | Polishing method | Via projection height P (μm) | Surface roughness Ra (μm) | Amount of curvature W (μm) | Resistance (mΩ) | Appearance | Adhesive strength (N) |
| --- | --- | --- | --- | --- | --- | --- | --- |
| Sample 1 | Blasting | 0 | 5 | 0 | 20 | Good | 1 |
| Sample 2 | Lapping | 2 | 0.5 | 1 | 20 | Good | 5 |
| Sample 3 | Lapping | 5 | 0.8 | 3 | 20 | Good | 5 |
| Sample 4 | Lapping | 10 | 1.2 | 7 | 20 | Good | 5 |
| Sample 5 | Lapping | 15 | 2.0 | 10 | 20 | Good | 5 |
| Sample 6 | Lapping | 18 | 2.4 | 13 | 20 | Poor | 5 |
| Sample 7 | No polishing | 25 | 10 | 40 | 40 | Poor | 3 |

In the sample 1, the via projection height P is less than the surface roughness Ra. This indicates that the via conductors are pushed in by spraying abrasive grains, and the upper surface of the laminate is embrittled. As a result, the external electrodes are in an easily separable state, and the adhesive strength is decreased. Therefore, the sample 1 was judged as being unsuitable.

In the sample 7, thinning of the external electrodes due to the excessively large via projection height P was visually observed. Since the amount of curvature W is greater than the via projection height P, variation in height of the external electrodes is increased. Also, the resistance is increased as compared with the other samples. SEM (Scanning Electron Microscope) observation showed that this is caused by oxide films formed at the ends of the via conductors.

In the sample 6, thinning of the external electrodes was visually observed. However, no problem was observed in the adhesive strength and the resistance, and thus, the sample 6 was judged as being suitable.

The samples 2 to 5 were problem-free samples.

On the basis of the above-described experiment, it can be understood that in order to suppress variations in height of the first and second external electrodes 12 and 13 in the lamination direction, form the first and second external electrodes 12 and 13 without thinning, and improve the adhesive strength between the first and second external electrodes 12 and 13 and the first surface 18a of the laminate 18 even when curving occurs in the multilayer capacitor 1 during firing, the via projection height P must be greater than the surface roughness Ra of the upper surface 18a and the amount of curvature W of the laminate 18.

Second Preferred Embodiment

Figure 10:
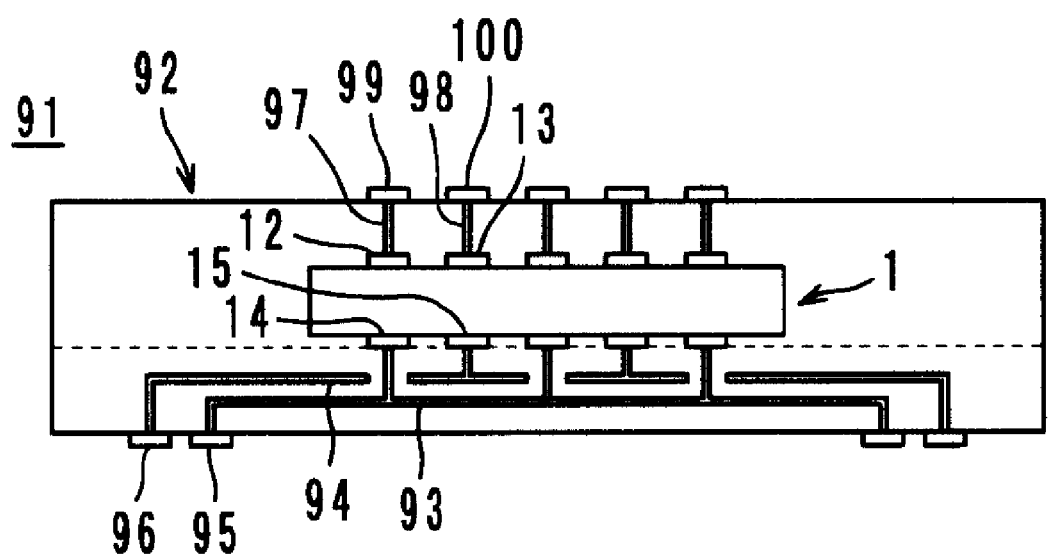
FIG. 10 is a sectional view showing the structure of a circuit board including the multilayer capacitor shown in FIG. 1.

A circuit board using the multilayer capacitor 1 according to the first preferred embodiment will be described with reference to the drawings. FIG. 10 is a sectional view of the structure of a circuit board 91 including the multilayer capacitor 1.

The circuit board 91 includes the multilayer capacitor 1, a board body 92, first wiring 93, second wiring 94, a ground terminal 95, a power supply terminal 96, third wiring 97, fourth wiring 98, first external terminals 99, and second external terminals 100.

The board body 92 is formed by laminating insulating resin layers. The ground terminal 95 is provided on the lower surface of the board body 92 so that a ground potential is applied to the ground terminal 95. The power supply terminal 96 is provided on the lower surface of the board body 92 so that a power supply voltage is applied to the power supply terminal 96.

The first wiring 93 is provided in the board body 92, for electrically connecting the ground terminal 95 to the third external electrodes 14 of the multilayer capacitor 1. The second wiring 94 is provided in the board body 92, for electrically connecting the power supply terminal 96 to the fourth external electrodes 15 of the multilayer capacitor 1.

The multilayer capacitor 1 is mounted on the board body 92 so that the third and fourth external electrodes 14 and 15 are disposed at a lower position in the lamination direction.

The third wiring 97 is formed in the board body 92, for electrically connecting the first external electrodes 12 to the first external terminals 99. The fourth wiring 98 is provided in the board body 92, for electrically connecting the second external electrodes 13 to the second external terminals 100. The first external terminals 99 are provided on the upper surface of the board body 92 to function to supply the ground potential to an IC mounted on the circuit board 91. The second external terminals 100 are formed on the upper surface of the board body 92 to function to supply the power supply voltage to an IC mounted on the circuit board 91.

The method for manufacturing the circuit board 91 constructed as described above will be described. First, a resin board corresponding to a portion below a dotted line in the circuit board 91 shown in FIG. 10 is prepared. The multilayer capacitor 1 is mounted on the resin board.

Next, a prepreg sheet including uncured thermosetting resin is placed on the multilayer capacitor 1 and then pressed from above in the lamination direction. Then, the prepreg sheet is cured by heating.

Next, via holes are formed in the upper surface of the board body 92 using a laser. When the via holes are formed, the first and second external electrodes 12 and 13 have been formed, and thus the laser is not applied directly to the laminate 18, thereby preventing damage to the laminate 18. Then, the via holes are filled with a conductive resin including a metal powder of Cu and a thermosetting resin, such as an epoxy resin, to form the third and fourth wirings 97 and 98. The third and fourth wirings 97 and 98 may be formed by so-called via filling in which the via holes are filled with a metal by plating.

Next, the first and second external terminals 99 and 100 are formed by etching a metal foil of Cu or other suitable material. The first and second external terminals 99 and 100 may be Au bumps or conductive resin bumps formed immediately above the third and fourth wirings 97 and 98.

As described above, the first and second external electrodes 12 and 13 are formed on the multilayer capacitor 1, and thus, in forming the via holes in the upper surface of the board body 92 using the laser, damage to the laminate 18 by the laser is prevented. However, members corresponding to the first and second external electrodes 12 and 13 are not present in the multilayer electronic components disclosed in Japanese Unexamined Patent Application Publication Nos. 2003-318064 and 2003-318065. Therefore, the effect of the multilayer capacitor 1 is not exhibited by the multilayer electronic components disclosed in the above two documents.

Third Preferred Embodiment

Figure 11:
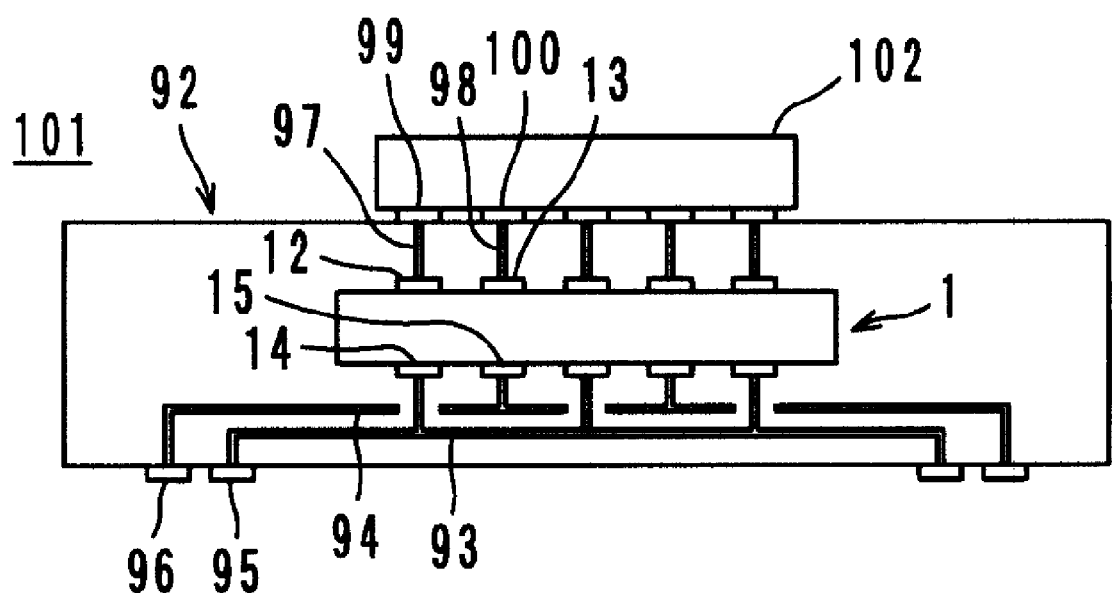
FIG. 11 is a sectional view showing the structure of a circuit module including the circuit board shown in FIG. 10.
Figure 12:
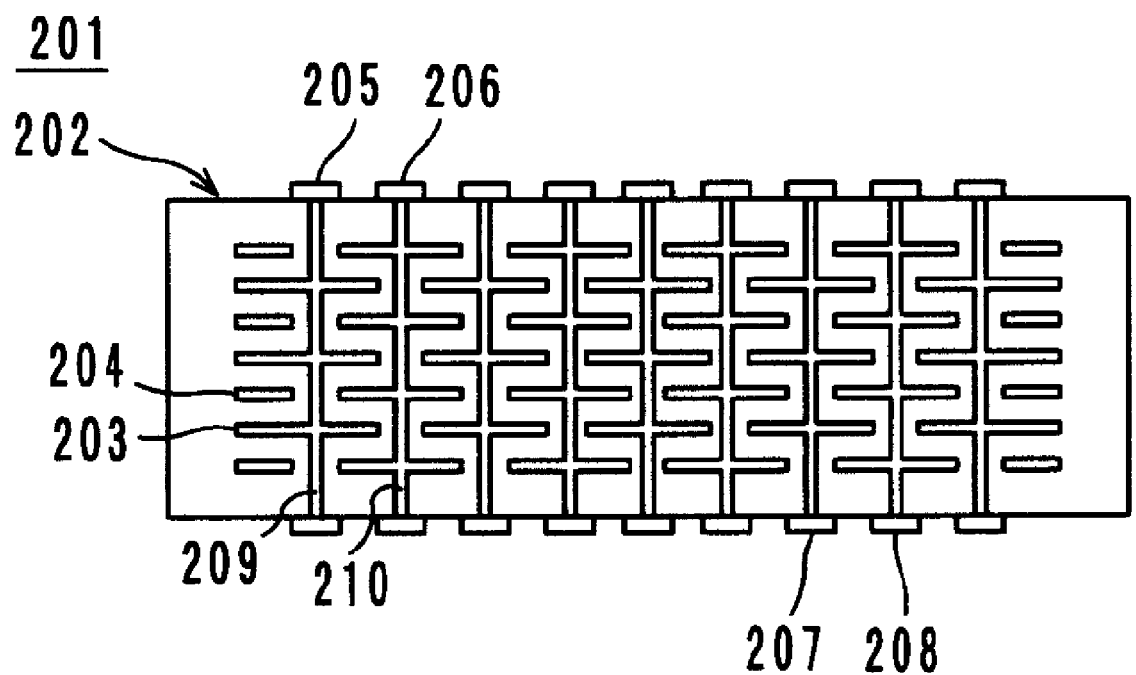
FIG. 12 is a sectional view showing the structure of a conventional multilayer capacitor.

FIG. 11 is a sectional view of the structure of a circuit module 101 according to a third preferred embodiment. As shown in FIG. 11, the circuit module 101 includes MPU 102 mounted as an IC on the circuit board 91. The MPU 102 is mounted directly above the multilayer capacitor 1.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A multilayer capacitor comprising:
    a laminate including a plurality of ceramic layers, and which has a first surface and a second surface opposing the first surface;
    at least one pair of first and second internal electrodes opposed to each other with the ceramic layer provided therebetween;
    first and second external electrodes provided on the first surface;
    third and fourth external electrodes provided on the second surface;
    a first via conductor arranged to electrically connect the first external electrode, the first internal electrode, and the third external electrode, the first via conductor being arranged to pass between the first and second surfaces and to have an end projecting from the first surface; and
    a second via conductor arranged to electrically connect the second external electrode, the second internal electrode, and the fourth external electrode, the second via conductor being arranged to pass between the first and second surfaces and to have an end projecting from the first surface; wherein
    relationships $P \geqq Ra$ and $P \geqq W$ are provided, wherein P represents an average projection height of the first and second via conductors from the first surface, Ra represents a surface roughness of the first surface, and W represents an amount of curvature of the laminate; and
    the projecting portions of the first and second via conductors projecting from the first surface are buried in the first and second external electrodes, respectively.

2. The multilayer capacitor according to claim 1, wherein the average projection height P is about 2 µm to about 15 µm.

3. The multilayer capacitor according to claim 1, wherein the surface roughness Ra is about 2 µm or less.

4. The multilayer capacitor according to claim 1, wherein the amount of curvature W of the laminate is about 10 µm or less.

5. A circuit board comprising:
    a board body made of an insulating material;
    a plurality of input/output terminals provided on a surface of the board body;
    a plurality of wirings electrically connected to the input/output terminals; and
    the multilayer capacitor according to claim 1; wherein
    in a state in which the plurality of wirings is electrically connected to the third and fourth external electrodes, the multilayer capacitor is mounted on the board body.

6. A circuit module comprising:
    the circuit board according to claim 5; and
    a semiconductor integrated circuit mounted on the circuit board; wherein
    the multilayer capacitor is electrically connected to the semiconductor integrated circuit through the first and second external electrodes.

* * * * *